(12) United States Patent
Haque et al.

(10) Patent No.: US 10,995,001 B2
(45) Date of Patent: May 4, 2021

(54) GRAPHENE OXIDE PERCOLATION NETWORK

(71) Applicant: Nokia Technologies Oy, Espoo (FI)

(72) Inventors: Samiul Md Haque, Cambridge (GB);
Elisabetta Spigone, Cambridge (GB);
Jani Kivioja, Cambourne (GB)

(73) Assignee: Nokia Technolgies Oy, Espoo (FI)

( * ) Notice: Subject to any disclaimer, the term of this patent is extended or adjusted under 35 U.S.C. 154(b) by 338 days.

(21) Appl. No.: 15/312,656

(22) PCT Filed: Jul. 25, 2014

(86) PCT No.: PCT/EP2014/066107
§ 371 (c)(1),
(2) Date: Nov. 20, 2016

(87) PCT Pub. No.: WO2015/180800
PCT Pub. Date: Dec. 3, 2015

(65) Prior Publication Data
US 2017/0184528 A1 Jun. 29, 2017

(30) Foreign Application Priority Data
May 27, 2014 (GB) .................................... 1409389

(51) Int. Cl.
*C01B 32/184* (2017.01)
*H01L 51/00* (2006.01)
(Continued)

(52) U.S. Cl.
CPC .............. *C01B 32/184* (2017.08); *G01K 7/16* (2013.01); *G01N 27/048* (2013.01);
(Continued)

(58) Field of Classification Search
CPC .................................................. C01B 32/184
See application file for complete search history.

(56) References Cited

U.S. PATENT DOCUMENTS

2010/0039028 A1* 2/2010 Suzuki ................... H01L 27/322
313/504
2011/0084252 A1* 4/2011 Wu ......................... B82Y 30/00
257/40
(Continued)

FOREIGN PATENT DOCUMENTS

EP 2362459 A1 8/2011
EP 2365459 8/2011
(Continued)

OTHER PUBLICATIONS

International Search Report and Written Opinion received for corresponding Patent Cooperation Treaty Application No. PCT/EP2014/066107, dated Feb. 13, 2015, 11 pages.
Vineet Dua et al: "All-Organic Vapor Sensor Using Inkjet-Printed Reduced Graphene Oxide", Angewandte Chemie International Edition, vol. 49, No. 12, Mar. 15, 2010 (Mar. 15, 2010), pp. 2154-2157.
(Continued)

*Primary Examiner* — William D Young
(74) *Attorney, Agent, or Firm* — Harrington & Smith

(57) ABSTRACT

A percolation network of functionalised reduced graphene oxide flakes, the percolation network configured to allow for hopping of charge carriers between adjacent reduced graphene oxide flakes to enable a flow of charge carriers through the percolation network, and wherein the reduced graphene oxide flakes are functionalised to facilitate detectable changes in the flow of charge carriers in response to a stimulus to the percolation network.

18 Claims, 9 Drawing Sheets

(51) Int. Cl.
    *H01L 51/05* (2006.01)
    *G01K 7/16* (2006.01)
    *G01N 27/04* (2006.01)
    *H01L 51/10* (2006.01)

(52) U.S. Cl.
    CPC ...... *H01L 51/0004* (2013.01); *H01L 51/0045* (2013.01); *H01L 51/0575* (2013.01); *H01L 51/107* (2013.01)

(56) References Cited

U.S. PATENT DOCUMENTS

| | | |
|---|---|---|
| 2012/0214172 A1 | 8/2012 | Chen et al. |
| 2013/0099196 A1 | 4/2013 | Wu et al. |
| 2013/0162333 A1 | 6/2013 | Colli et al. |
| 2013/0197256 A1 | 8/2013 | Wu et al. |
| 2013/0214252 A1 | 8/2013 | Park et al. |
| 2014/0070082 A1 | 3/2014 | Guo et al. |
| 2014/0103298 A1 | 4/2014 | Lee et al. ............ 257/29 |

FOREIGN PATENT DOCUMENTS

| | | |
|---|---|---|
| JP | H01-276059 A | 11/1989 |
| JP | H02-107958 A | 4/1990 |
| WO | 2009/143405 A2 | 11/2009 |
| WO | 2013/040636 A1 | 3/2013 |
| WO | 2013/070339 A1 | 5/2013 |
| WO | 2013/184072 A1 | 12/2013 |
| WO | 2014/028978 A1 | 2/2014 |

OTHER PUBLICATIONS

Honglei Guo et al: "Preparation of reduced graphene oxide by infrared irradiation induced photothermal reduction", Nanoscale, vol. 5, No. 19, Jan. 1, 2013 (Jan. 1, 2013), p. 9040 and p. 9046.
Wang et al., "A Flexible UV Nanosensor Based on Reduced Graphene Oxide Decorated Zno Nanostructures", Nanoscale, vol. 4, No. 8, 2012, pp. 2678-2684.
Liu et al., "High Performance Ultraviolet Photodetector Fabricated with ZnO Nanoparticles-graphene Hybrid Structures", Chinese Journal of Chemical Physics, vol. 26, No. 2, Apr. 27, 2013, pp. 225-230.
Trung et al., "Flexible and Transparent Nanocomposite of Reduced Graphene Oxide and P(VDF-TRFE) Copolymer for High Thermal Responsivity in a Field-effect Transistor", Advanced Functional Materials, vol. 24, No. 22, Jun. 11, 2014, pp. 1-8.
Lipatov et al., "Highly Selective Gas Sensor Arrays Based on Thermally Reduced Graphene Oxide" Nanoscale, vol. 5, No. 12, 2013, pp. 5426-5434.
Su et al., "Flexible NO2 Sensors Fabricated by Layer -by- layer Covalent Anchoring and in Situ Reduction of Graphene Oxide", Sensors and Actuators B: Chemical, vol. 190, Jan. 2014, pp. 865-872.
Search Report received for corresponding United Kingdom Patent Application No. 1409389.2, dated Jan. 30, 2015, 4 pages.
Office action received for corresponding Japanese Patent Application No. 2016-569839, dated Jan. 9, 2018, 3 pages of office action and 6 pages of translation available.
Final office action received for corresponding Japanese Patent Application No. 2016-569839, dated Oct. 30, 2018, 2 pages of office action and 2 pages of translation available.

\* cited by examiner

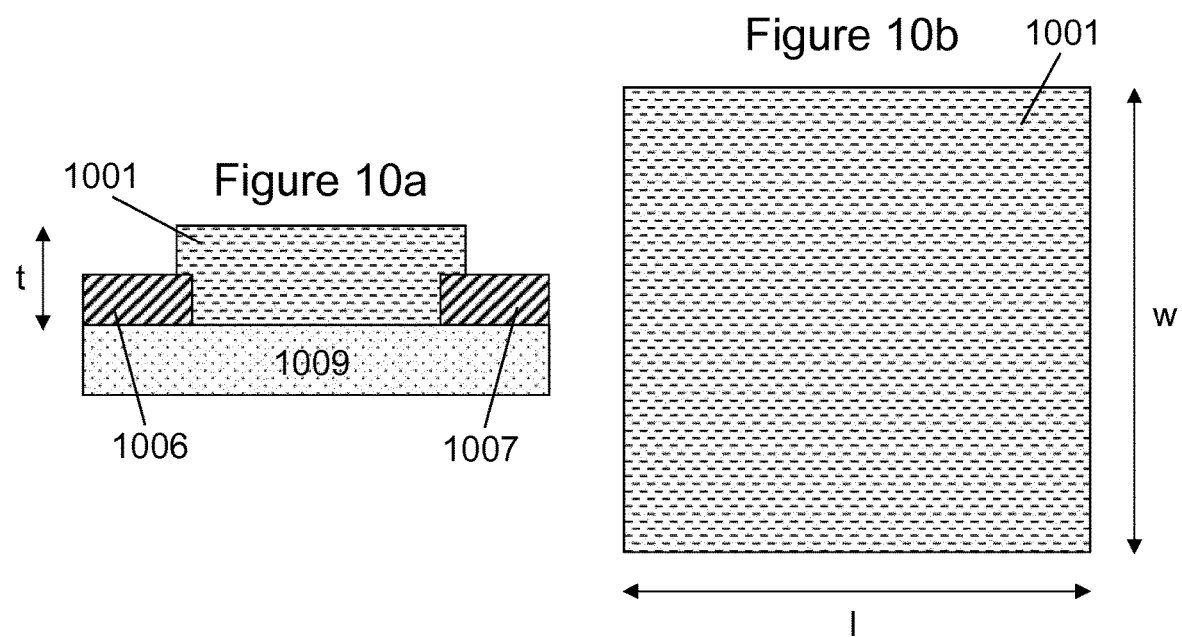
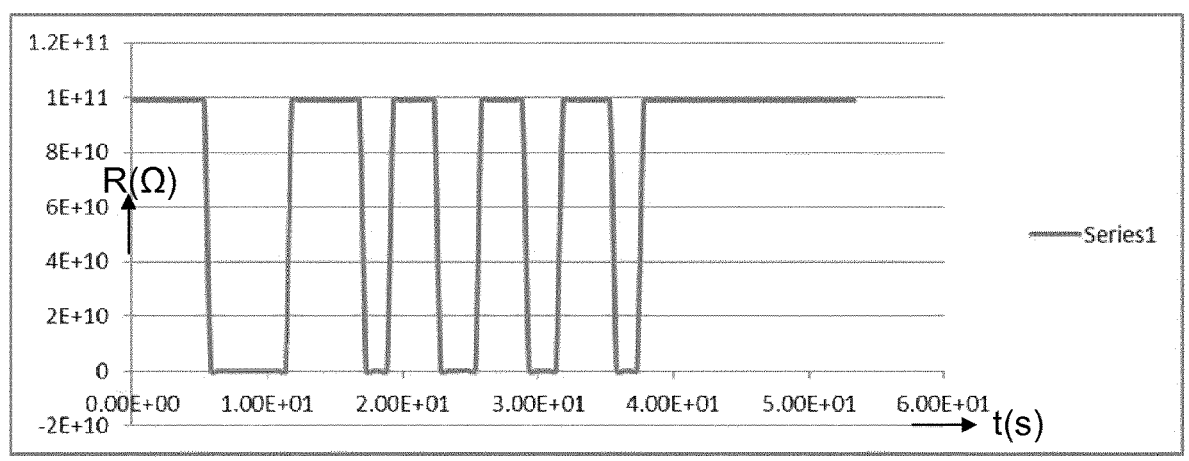

GRAPHENE OXIDE PERCOLATION NETWORK

RELATED APPLICATION

This application was originally filed as PCT Application No. PCT/EP2014/066107 filed Jul. 25, 2014 which claims priority benefit from GB Patent Application No. 1409389.2, filed May 27, 2014.

TECHNICAL FIELD

The present disclosure relates to the field of sensors, associated methods and apparatus, and in particular concerns a percolation network of reduced graphene oxide flakes configured to facilitate detectable changes in a flow of charge carriers through the percolation network in response to an applied stimulus. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new sensors (such as environmental sensors) which can be produced at lower cost with improved sensitivity when compared to existing sensors.

One or more aspects/embodiments of the present disclosure may or may not address one or more of these issues.

The listing or discussion of a prior-published document or any background in this specification should not necessarily be taken as an acknowledgement that the document or background is part of the state of the art or is common general knowledge.

SUMMARY

According to a first aspect, there is provided a percolation network of functionalised reduced graphene oxide flakes, the percolation network configured to allow for hopping of charge carriers between adjacent reduced graphene oxide flakes to enable a flow of charge carriers through the percolation network, and wherein the reduced graphene oxide flakes are functionalised to facilitate detectable changes in the flow of charge carriers in response to a stimulus to the percolation network.

The reduced graphene oxide flakes may be functionalised to comprise a substantially even distribution of reduced graphene oxide flakes. The substantially even distribution may comprise one or more of: a substantially regular spacing between adjacent reduced graphene oxide flakes; and a substantial non-clustering of reduced graphene oxide flakes. One or more of the substantially even distribution and the substantial non-clustering may apply to one of at least 50%, 55%, 60%, 65%, 70%, 75%, 80%, 85%, 90%, 95% and 98% of the reduced graphene oxide flakes.

The reduced graphene oxide flakes may be substantially planar. The reduced graphene oxide flakes may be functionalised such that the planes of the reduced graphene oxide flakes are aligned substantially parallel to one another. The planes of one of at least 50%, 55%, 60%, 65%, 70%, 75%, 80%, 85%, 90%, 95% and 98% of the reduced graphene oxide flakes may be aligned substantially parallel to one another. The planes of the reduced graphene oxide flakes may be aligned to within one of at least 5°, 10°, 15°, 20°, 25°, 30°, 35° and 40° of one another.

The reduced graphene oxide flakes may be functionalised such that the percolation network comprises a substantially overlapping stacked arrangement of the reduced graphene oxide flakes. One of at least 50%, 55%, 60%, 65%, 70%, 75%, 80%, 85%, 90%, 95% and 98% of the reduced graphene oxide flakes may overlap with another reduced graphene oxide flake of the percolation network. The extent of overlap of the reduced graphene oxide flakes may be sufficient to allow a flow of charge carriers from one reduced graphene oxide flake to another reduced graphene oxide flake. Adjacent reduced graphene oxide flakes may overlap across one of at least 2%, 5%, 10%, 20%, 30%, 40% and 50% of their length in one of their planar axes/directions.

The reduced graphene oxide flakes may comprise a surfactant attached to the surfaces thereof. The reduced graphene oxide flakes may be non-polar.

The stimulus may comprise one or more of light, strain, temperature and humidity.

The percolation network may be printed.

The percolation network may have a predetermined thickness associated with the detection of a particular stimulus. The predetermined thickness may be such that the reduced graphene oxide flakes are functionalised to selectively facilitate detectable changes in the flow of charge carriers in response to the particular stimulus. The particular stimulus may be humidity, and the associated predetermined thickness may be one or more of 1-250 nm, 5 nm-250 nm and 100-200 nm. The particular stimulus may be temperature, and the associated predetermined thickness may be one or more of at least 500 nm and 500-1000 nm. The particular stimulus may be light or strain, and the associated predetermined thickness may be one or more of at least 500 nm and 500-2000 nm. One or more of the length and width of the percolation network may be 0.3-5 mm.

According to a further aspect, there is provided an apparatus comprising any percolation network described herein.

The apparatus may comprise two or more percolation networks. Each percolation network may have a predetermined thickness associated with the detection of a particular respective stimulus. Some or all of the percolation networks may have the same predetermined thickness to enable detection of the same stimulus. Some or all of the percolation networks may have the different predetermined thicknesses to enable detection of different respective stimuli.

The percolation networks may be arranged to form a stack or an array. The array may be a one, two or three dimensional array. The percolation networks can form part of a modular electronic board (rigid or flexible) architecture in an array.

The uppermost percolation network of the stack may have a predetermined thickness associated with the detection of humidity. The apparatus may comprise a passivation layer on top of the uppermost percolation network. The passivation layer may be sufficiently porous to allow exposure of the uppermost percolation network to the air of the surrounding environment to enable the detection of humidity.

A percolation network of the stack may have a predetermined thickness associated with the detection of light. Each of the layers of the apparatus above the percolation network may be sufficiently optically transparent to allow exposure of the percolation network to incident light from the surrounding environment to enable detection of the incident light.

The apparatus may comprise one or more electrically insulating layers configured to separate adjacent percolation networks of the stack.

The percolation networks may be laminated together using anisotropic conductive adhesive/films to form the stack.

The apparatus may comprise source and drain electrodes configured to enable the flow of charge carriers from the source electrode through the percolation network to the drain electrode. The apparatus may be configured such that exposure of the percolation network to a stimulus causes the detectable changes in the flow of charge carriers. The source and drain electrodes may be interdigitated electrodes. The source and drain electrodes may comprise one or more of silver, chromium, gold, platinum, copper, a combination of metals, graphene, indium tin oxide and PDOT:PSS. The source and drain electrodes may be strainable (e.g. one or more of flexible, stretchable and compressible). The source and drain electrodes may be optically transparent.

The apparatus may comprise two or more percolation networks. The source and drain electrodes may be common to some or all of the percolation networks. The apparatus may comprise a respective pair of source and drain electrodes for use with each percolation network.

The apparatus may comprise a strainable or rigid substrate configured to support the percolation network. The strainable substrate may be one or more of a flexible, stretchable and compressible substrate. The percolation network may be configured to undergo strain with the substrate across operational straining of the strainable substrate. The substrate may comprise one or more of polyethylene naphthalate, polyethylene tetraphalate, Kapton™, flexible glass of <300 µm in thickness, polydimethylsiloxane and polyurethane. The substrate may be optically transparent.

The apparatus may be one or more of an electronic device, a portable electronic device, a portable telecommunications device, a sensor and a module for one or more of the same.

According to a further aspect, there is provided a reduced graphene oxide ink comprising a suspension of functionalised reduced graphene oxide flakes, wherein the reduced graphene oxide flakes comprise a surfactant configured to decrease the liquid-phobicity or increase the liquid-philicity of the reduced graphene oxide flakes such that the reduced graphene oxide flakes are functionalised.

The surfactant may be configured to decrease the liquid-phobicity or increase the liquid-philicity of the reduced graphene oxide flakes such that the reduced graphene oxide flakes are functionalised so that they have a substantially even distribution within the suspension. The surfactant may be configured to decrease the liquid-phobicity or increase the liquid-philicity of the reduced graphene oxide flakes such that the reduced graphene oxide flakes are functionalised so that they retain the substantially even distribution within the suspension for a predetermined period of time. The predetermined period of time may be up to a day, week, month, year or decade.

The reduced graphene oxide flakes may be substantially planar. The surfactant may be configured to decrease the liquid-phobicity or increase the liquid-philicity of the reduced graphene oxide flakes such that the reduced graphene oxide flakes are functionalised so that they are aligned substantially parallel to one another within the suspension.

The surfactant may be configured to decrease the liquid-phobicity or increase the liquid-philicity of the reduced graphene oxide flakes such that the reduced graphene oxide flakes are functionalised to form an overlapping stacked arrangement within the suspension.

The surfactant may be configured to depolarise the reduced graphene oxide flakes. The surfactant may comprise an amphiphile. The surfactant may be electrically insulating. The surfactant may comprise Triton™ X-100.

The suspension may comprise water. The surfactant may be configured to decrease the hydrophobicity or increase the hydrophilicity of the reduced graphene oxide flakes such that the reduced graphene oxide flakes are functionalised.

According to a further aspect, there is provided a method of forming a reduced graphene oxide ink, the method comprising:
  using a surfactant to modify the surface chemistry of one or more surfaces of reduced graphene oxide flakes, the surfactant configured to decrease the liquid-phobicity or increase the liquid-philicity of the reduced graphene oxide flakes; and
  suspending the modified reduced graphene oxide flakes to form the reduced graphene oxide ink such that the reduced graphene flakes are functionalised within the suspension.

The method may comprise suspending the reduced graphene oxide flakes within a liquid or solution comprising the surfactant to form the reduced graphene oxide ink.

The surfactant may modify the surface chemistry by attaching itself to one or more surfaces of the reduced graphene oxide flakes.

The method may comprise forming the reduced graphene oxide flakes. Forming the reduced graphene oxide flakes may comprise reducing graphene oxide flakes using an acid. The acid may comprise ascorbic acid. The reduced graphene oxide flakes may be formed by hydrazine reduction.

According to a further aspect, there is provided a method of forming a percolation network of functionalised reduced graphene oxide flakes, the method comprising:
  depositing reduced graphene oxide ink, the reduced graphene oxide ink comprising a suspension of functionalised reduced graphene oxide flakes, the reduced graphene oxide flakes comprising a surfactant configured to decrease the liquid-phobicity or increase the liquid-philicity of the reduced graphene oxide flakes such that the reduced graphene oxide flakes are functionalised; and
  drying the reduced graphene oxide ink to form the percolation network of functionalised reduced graphene oxide flakes, the percolation network configured to allow for hopping of charge carriers between adjacent reduced graphene oxide flakes to enable a flow of charge carriers through the percolation network, and wherein the reduced graphene oxide flakes are functionalised to facilitate detectable changes in the flow of charge carriers in response to a stimulus to the percolation network.

The method may comprise:
  depositing a controlled amount of the reduced graphene oxide ink; and drying the reduced graphene oxide ink to form a percolation network of functionalised reduced graphene oxide flakes having a predetermined thickness associated with the detection of a particular stimulus.

Depositing the reduced graphene oxide ink may comprise one or more of printing, inkjet printing, spray coating, screen printing, drop casting and roll-to-roll printing (e.g. using gravure flexo or a combination of printing processes) the reduced graphene oxide ink. The method may comprise exposing the reduced graphene oxide ink to an ultrasonic field and toluene, after deposition, to remove the surfactant. The method may comprise depositing the reduced graphene oxide ink to form a thin film of reduced graphene oxide ink.

The method may comprise controlling one or more parameters of the deposition process to deposit the controlled amount of reduced graphene oxide ink. The deposition process may comprise printing, and one of the parameters may be the number of printing passes. The particular stimulus may be humidity, and the method may comprise depositing the controlled amount of reduced graphene oxide ink using 1-5 printing passes. The particular stimulus may be temperature, and the method may comprise depositing the controlled amount of reduced graphene oxide ink using 10-20 printing passes. The particular stimulus may be light or strain, and the method may comprise depositing the controlled amount of reduced graphene oxide ink using 10-40 printing passes.

The method may be controlled using various parameters of the printing equipment itself such as the substrate temperature during printing and the cartridge temperature during deposition to optimize the printing process. A printer containing hundreds of nozzles can be printing a thick layer in one pass and the variability depends on the printing process and control of the film thickness.

The method may comprise removing the surfactant from the deposited reduced graphene oxide flakes of the percolation network.

The method may comprise:
depositing two or more controlled amounts of reduced graphene oxide ink; and
drying the reduced graphene oxide ink to form a plurality of percolation networks of functionalised reduced graphene oxide flakes, each percolation network having a predetermined thickness associated with the detection of a particular respective stimulus.

The method may comprise depositing the same amount of reduced graphene oxide ink for some or all of the percolation networks. The method may comprise depositing different amounts of reduced graphene oxide ink for some or all of the percolation networks.

The method may comprise depositing the two or more controlled amounts of reduced graphene oxide ink adjacent to one another to form an array of percolation networks. The method may comprise depositing the two or more controlled amounts of reduced graphene oxide ink on top of one another to form a stack of percolation networks. The method may comprise laminating two or more of the percolation networks together after drying to form a stack of percolation networks.

The method may comprise depositing electrically insulating layers to separate adjacent percolation networks of the stack.

According to a further aspect, there is provided a method of using an apparatus,
the apparatus comprising a source electrode, a drain electrode and a percolation network of functionalised reduced graphene oxide flakes, the source and drain electrodes configured to enable a flow of charge carriers from the source electrode through the percolation network to the drain electrode, the percolation network configured to allow for hopping of charge carriers between adjacent reduced graphene oxide flakes to enable the flow of charge carriers through the percolation network, and wherein the reduced graphene oxide flakes are functionalised to facilitate detectable changes in the flow of charge carriers in response to a stimulus to the percolation network,
the method comprising, in response to exposure of the percolation network to a stimulus, measuring the flow of charge carriers from the source electrode through the percolation network to the drain electrode to determine the presence and/or magnitude of the stimulus.

The apparatus may comprise two or more percolation networks each having a predetermined thickness associated with the detection of a particular respective stimulus. The method may comprise measuring the flow of charge carriers through one or more of the respective percolation networks to determine the presence and/or magnitude of the associated stimuli.

The steps of any method disclosed herein do not have to be performed in the exact order disclosed, unless explicitly stated or understood by the skilled person.

Corresponding computer programs (which may or may not be recorded on a carrier) for implementing one or more of the methods disclosed herein are also within the present disclosure and encompassed by one or more of the described example embodiments.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

FIG. 10a shows the thickness dimension of a percolation network;

FIG. 10b shows the length and width dimensions of a percolation network;

FIG. 11 shows the electrical behaviour of an apparatus comprising a percolation network in response to varying humidity;

DESCRIPTION OF SPECIFIC ASPECTS/EMBODIMENTS

Figure 1:
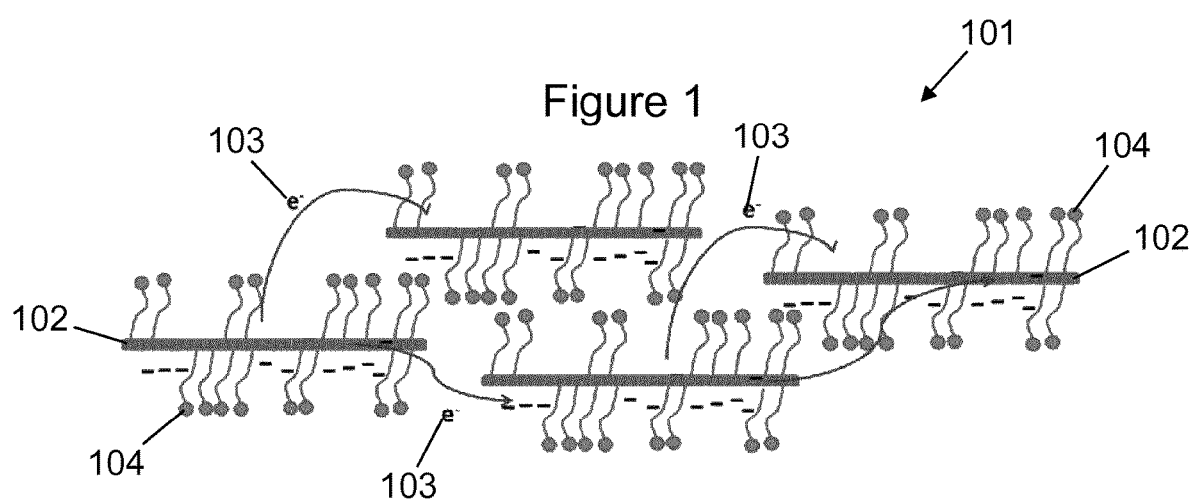
FIG. 1 shows a percolation network of functionalised reduced graphene oxide flakes.

Graphene-based optoelectronic devices have been attracting a lot of attention recently due to the potential of applications in many areas such as solar cells, touch screens and photodetectors. Although the integration of graphene into such devices may be useful, pristine graphene absorbs just 2.3% of light and therefore its application in photodetection is limited. In order to address this limitation, plasmonic effects, thermoelectric effects and sensitization using light absorbing materials have been used to enhance the interaction of graphene with photons.

Photosensitive materials such as quantum dots and chlorophyll have been used to create hybrid phototransistors in conjunction with graphene. When the photosensitive material is exposed to the light, photogenerated carriers are transferred to the graphene and the opposite carriers are trapped in the photosensitive layer. The trapped carriers create a gating effect that contributes to a change in conductance. Whilst these hybrid devices have demonstrated a high gain ($10^8$ electrons per photon absorbed in the case of quantum dots), they suffer from stability and manufacturing issues. In particular, quantum dots are expensive to fabricate and have shown degradation in their absorption properties over time. Also, the quantum dots used to create these high gain photodetectors typically consist of cadmium and lead, two materials which present health-related challenges that must be overcome before such devices can be commercialised. Moreover, the formation of a monolayer of quantum dots on top of a pristine graphene transistor is not straightforward.

Exfoliated graphene sheets have a theoretical surface area of 2600 m2/g2 and are therefore a highly desirable 2D catalyst support. Graphene is normally produced by mechanical or thermal exfoliation, chemical vapor deposition (CVD), epitaxial growth and also recently by chemical reduction. After the first report in 2004 of the successful mechanical exfoliation of a monolayer of graphene, there has been interest in finding a more efficient, cheaper and easier method of mass graphene production. By chemically oxidizing graphite, exfoliated sheets of graphene oxide can be produced. However, although this method may be scaled up for commercial and industrial applications, graphene oxide exhibits a significant loss in conductivity relative to pristine graphene and needs to be reduced in order to restore some of the sp2 hybrid network.

The deposition of graphene or graphene derivatives from solution may allow devices to be fabricated independently of substrate. Furthermore, thin films prepared from solution could offer easier processing and provide printability for device manufacturing. Suspensions of reduced graphene oxide (rGO) obtained by the reduction of graphene oxide, however, tend to be unstable due to the hydrophobic nature of the non-polar rGO flakes.

There will now be described an apparatus and associated methods that may or may not provide a solution to one or more of these issues.

FIG. 1 shows a percolation network 101 of functionalised rGO flakes 102. As illustrated, the percolation network 101 is configured to allow for hopping of charge carriers 103 (e.g. electrons or electron-holes) between adjacent rGO flakes 102 to enable a flow of charge carriers 103 through the percolation network 101. In this way, the rGO flakes 102 are functionalised to facilitate detectable changes in the flow of charge carriers 103 in response to an applied stimulus, as will be described later.

The term "functionalised" as used herein may be taken to mean that the rGO flakes 102 have a functional arrangement within the percolation network 101 which allows them to (or will allow them to) facilitate detectable changes in the flow of charge carriers 103. For example, the rGO flakes 102 may be functionalised to comprise a substantially even distribution of rGO flakes 102. In this scenario, the substantially even distribution may comprise one or more of a substantially regular spacing between adjacent rGO flakes 102, and a substantial non-clustering of rGO flakes 102. Also, this substantially even distribution/non-clustering of rGO flakes 102 may apply to at least 50%, 55%, 60%, 65%, 70%, 75%, 80%, 85%, 90%, 95% or 98% of the rGO flakes. A substantially even distribution and/or non-clustering of the rGO flakes may require that one or more of the difference in concentration (average number of particles per unit area/volume) and spacing of rGO flakes between difference regions of the percolation network is no more than 2%, 5%, 10%, 20%, 30%, 40% or 50%. The centres of adjacent rGO flakes 102 may have an average spacing of 2%, 5%, 10%, 20%, 30%, 40%, 50%, 60%, 70%, 80%, 90% or 100% of their length in one of their axes/directions, whilst allowing for hopping of charge carriers. These percentages are, of course, subject to the operational tolerances of the measurement tool (e.g. +/−5% or 10%).

Additionally or alternatively, the rGO flakes 102 may be substantially planar, and may be functionalised such that the planes of the rGO flakes 102 are aligned substantially parallel to one another. A substantially parallel alignment may involve at least 50%, 55%, 60%, 65%, 70%, 75%, 80%, 85%, 90%, 95% or 98% of the rGO flakes 102 being aligned substantially parallel to one another, and may imply that the rGO flakes 102 are aligned to within at least one of 5°, 10°, 15°, 20°, 25°, 30°, 35° and 40° of one another.

Furthermore, the rGO flakes 102 may be functionalised such that the percolation network 101 comprises a substantially overlapping stacked arrangement of the rGO flakes 102. A substantially overlapping stacked arrangement may comprise at least 50%, 55%, 60%, 65%, 70%, 75%, 80%, 85%, 90%, 95% or 98% of the rGO flakes 102 overlapping with another rGO flake 102 of the percolation network 101. Also, adjacent reduced graphene oxide flakes may overlap across at least 2%, 5%, 10%, 20%, 30%, 40% or 50% of their length in one of their planar axes/directions. For example, in FIG. 1, the degree of overlap is around 5-10%. This degree of overlap may allow a flow of charge carriers from one rGO flake to another.

In certain embodiments, the functionalised arrangement (e.g. in terms of concentration and spacing) of rGO flakes 102 within the percolation network 101 may be considered to be similar to the arrangement of liquid crystals within a liquid crystal display (LCD), but on a nanoscale or microscale, and allowing for hopping of charge carriers.

Each of the above-mentioned arrangements at least enables/facilitates a flow of charge carriers 103 through the percolation network 101. This electrical conductivity allows the presence and/or magnitude of a stimulus applied to the percolation network 101 to be determined by detecting/measuring the flow (or a change in the flow) of charge carriers 103 caused by the stimulus. In practice, the stimulus could be anything that causes a change in the flow of charge carriers 103 through the percolation network 101. For example, the stimulus may include one or more of light, strain, temperature and humidity.

As mentioned above, suspensions of rGO obtained by the reduction of graphene oxide tend to be unstable due to the hydrophobic nature of the rGO flakes 102. This issue is addressed herein by attaching surfactant molecules 104 to one or more surfaces of the rGO flakes 102 in order to decrease their liquid-phobicity or increase their liquid-philicity. In some cases, the surfactant molecules 104 may be dispersed over the surfaces of the rGO flakes 102. The term "liquid-phobicity" refers to the extent to which the rGO flakes 102 repel the liquid in which they are suspended. Likewise, the term "liquid-philicity" refers to the extent to which the rGO flakes 102 attract the liquid in which they are suspended. The liquid may comprise water, oil or any other solvent. When the suspending liquid comprises water, the surfactant 104 may decrease the hydrophobicity or increase the hydrophilicity of the rGO flakes 102. The surfactant 104 may be any amphiphilic molecule having a liquid-phobic group and a liquid-philic group, a suitable example of which is Triton™ X-100.

By modifying the surface chemistry of the rGO flakes 102 using surfactant molecules 104, a stable rGO suspension can be formed in which the rGO flakes 102 are functionalised to comprise one or more of the above-mentioned arrangements (i.e. substantially evenly distributed, substantially parallel and substantially overlapping) within the suspension. The surfactant molecules 104 therefore provide for a chemical change in the rGO flakes 102 which will have a consequential change in the physical relationship between adjacent rGO flakes 102 (the chemical change can be considered to leave a fingerprint in the physical relationship between adjacent rGO flakes). The suspension can then be deposited and subsequently dried to form a percolation network 101 with a substantially similar arrangement of rGO flakes 102. As a result of their surface modification, the rGO flakes 102 are able to retain the functional arrangement within the suspension for a predetermined period of time. For example, depending on the surfactant 104, the suspending liquid and the storage conditions, the rGO flakes 102 may be able to retain the arrangement for up to a day, a week, a month, a year or even a decade. Furthermore, by virtue of its physical and chemical stability, and its physical properties (e.g. viscosity, density, etc.), the rGO suspension may be deposited (on top of a supporting substrate or not) as an ink using conventional deposition techniques such as drop casting, spray coating or inkjet printing.

Although the surfactant molecules 104 in FIG. 1 are still attached to the rGO flakes 102 of the percolation network 101, they may be removed after deposition of the suspension using a suitable solvent (e.g. toluene for Triton™ X-100). When the surfactant molecules 104 are electrically insulating, their removal from the rGO flakes 102 may be required in order to allow a flow of charge carriers 103 through the percolation network 101.

Figure 2:
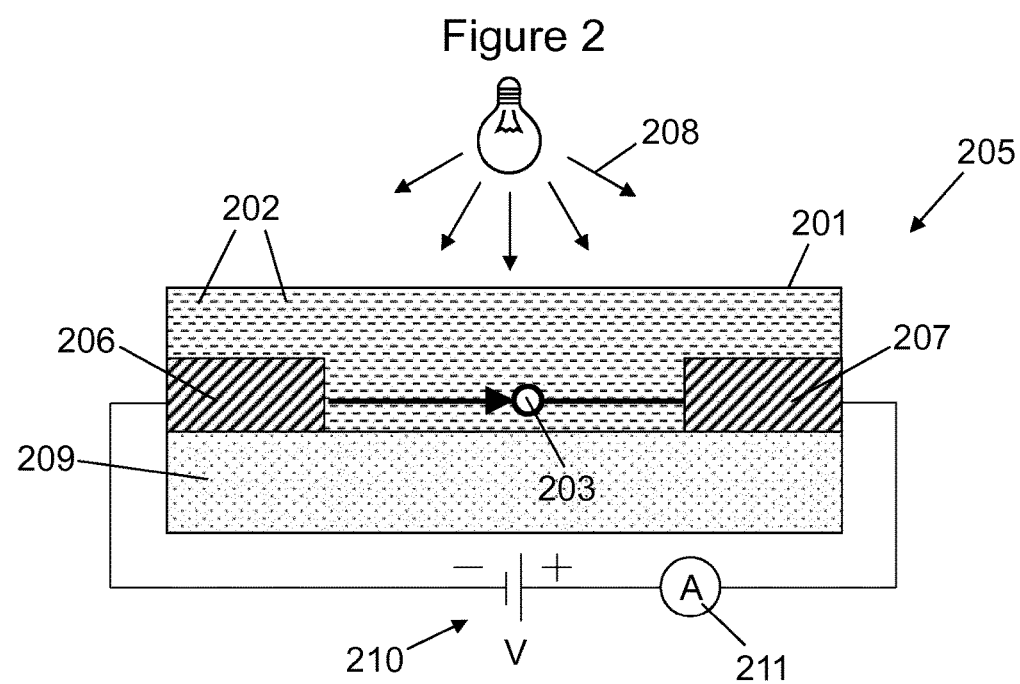
FIG. 2 shows an apparatus comprising a percolation network of functionalised reduced graphene oxide flakes.

FIG. 2 shows an apparatus 205 comprising a percolation network 201 of functionalised rGO flakes 202. The apparatus 205 also comprises source 206 and drain 207 electrodes configured to enable a flow of charge carriers 203 from the source electrode 206 through the percolation network 201 to the drain electrode 207 such that exposure of the percolation network 201 to a stimulus 208 (e.g. light, temperature, humidity and/or strain) can cause a detectable change in the flow of charge carriers 203. The source 206 and drain 207 electrodes may be interdigitated electrodes (e.g. comprising one or more metals, such as silver), and may be formed on top of a supporting substrate 209 together with the percolation network 201. The supporting substrate 209 can be strainable or rigid depending on the particular application. For example, if the apparatus 205 is intended for use as a strain sensor, the substrate 209 may be one or more of a flexible, stretchable and compressible substrate. A suitable substrate material in this scenario is polyethylene naphthalate (PEN). The percolation network would also strain (e.g. bend, stretch, compress, etc) within the operational strains of the substrate. In order to detect or measure the stimulus, a potential difference 210 (V) is applied between the source 206 and drain 207 electrodes to cause a steady flow of current through the percolation network 201. The current, conductance, resistance or other electrical property can then be monitored using a suitable meter 211 (e.g. ammeter, conductance meter or ohmmeter).

Figure 3:
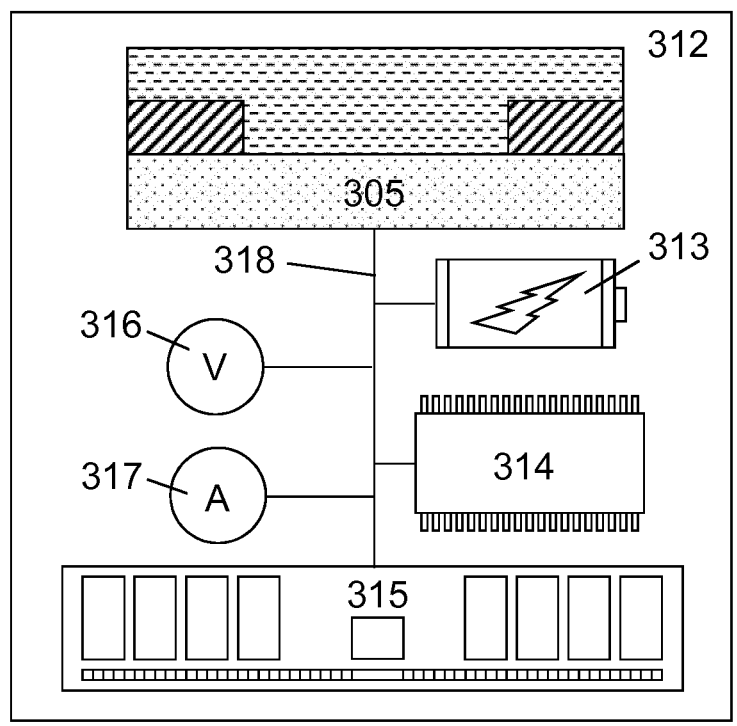
FIG. 3 shows another apparatus comprising a percolation network of functionalised reduced graphene oxide flakes.

FIG. 3 shows another apparatus 312 comprising a percolation network 301 of functionalised rGO flakes 302. The apparatus 312 may be one or more of an electronic device, a portable electronic device, a portable telecommunications device, a sensor and a module for one or more of the same. In this example, the device/apparatus 312 comprises the apparatus 305 of FIG. 2, a power source 313, a processor 314, a storage medium 315, a voltmeter 316 and an ammeter 317, which are electrically connected to one another by a data bus 318.

The power source 313 is configured to apply a voltage between the source and drain electrodes, the voltmeter 316 is configured to measure the applied voltage, and the ammeter 317 is configured to measure the resulting current flowing through the percolation network. The power source 313 is also configured to provide the other components with electrical power to enable their operation.

The processor 314 is configured for general operation of the apparatus 312 by providing signalling to, and receiving signalling from, the other components to manage their operation. In addition, the processor 314 is configured to receive the voltage and current measurements from the voltmeter 316 and ammeter 317, respectively, and derive the presence and/or magnitude of the stimulus using the voltage and current measurements.

The storage medium 315 is configured to store computer code configured to perform, control or enable operation of the apparatus 312. The storage medium 315 may also be configured to store settings for the other components. The processor 314 may access the storage medium 315 to retrieve the component settings in order to manage the operation of the other components. The storage medium 315 may also be configured to store calibration data (e.g. predetermined measurements of stimulus levels versus current/ conductance/resistance) for use by the processor 314 in deriving the presence and/or magnitude of the physical stimulus.

The processor 314 may be a microprocessor, including an Application Specific Integrated Circuit (ASIC). The storage medium 315 may be a temporary storage medium such as a volatile random access memory. On the other hand, the storage medium 315 may be a permanent storage medium such as a hard disk drive, a flash memory, or a non-volatile random access memory.

A number of experiments were performed to test the behaviour of the apparatus. In order to carry out these experiments, an aqueous rGO suspension with the surfactant Triton™ X-100 was drop casted on top of interdigitated source and drain electrodes and subsequently dried to form the percolation network.

Figure 4:
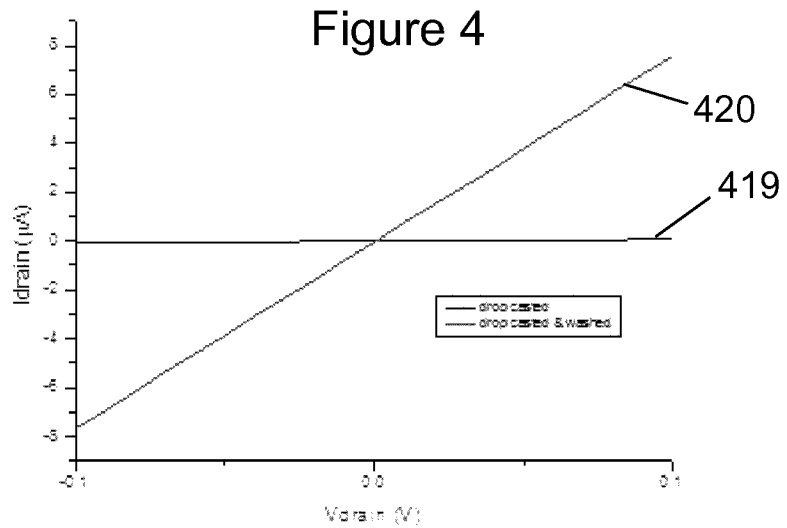
FIG. 4 shows the I-V characteristics of a percolation network before and after the removal of surfactant.

FIG. 4 shows the I-V characteristics of the percolation network before 419 and after 420 the removal of surfactant. As can be seen, the resistance of the percolation network decreased noticeably after the surfactant was removed.

To determine the electrical response of the percolation network to incident light, a white light source was positioned 15 cm from the apparatus to excite photons on the surface of the percolation network via an absorption-excitation mechanism. A bias of 100 mV was applied between the source and drain electrodes to produce a steady current before excitation. The light source was then used to illuminate the apparatus. After about 1000 seconds, the intensity of the light was varied rapidly.

Figure 5:
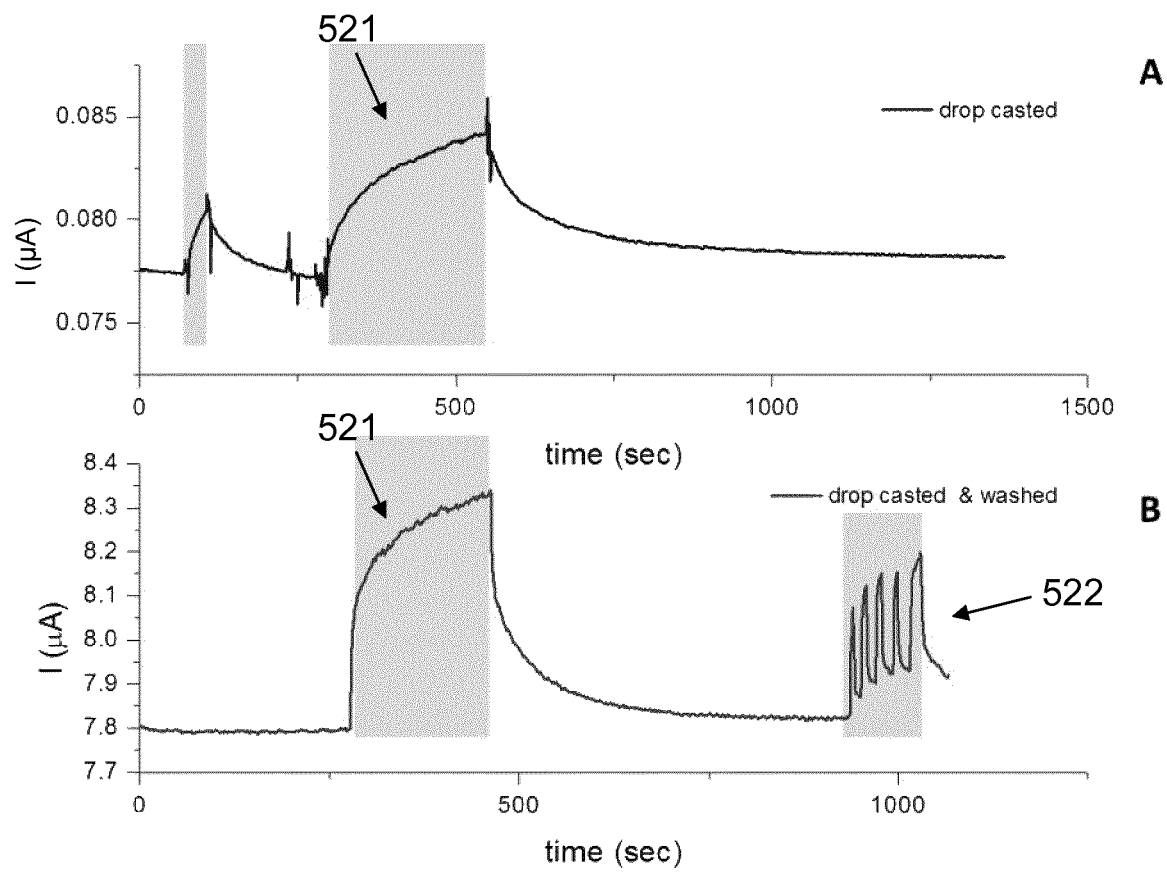
FIG. 5a shows the electrical behaviour of an apparatus comprising a percolation network in response to light exposure before the removal of surfactant.
FIG. 5b shows the electrical behaviour of an apparatus comprising a percolation network in response to light exposure after the removal of surfactant.

FIGS. 5a and 5b respectively show the electrical response of the apparatus before and after the surfactant was removed. Both figures show a peak 521 in current when the light was switched on, but the measured current was significantly greater after the surfactant was removed. When the surfactant was present (FIG. 5a), the measured current reached around 80 nA, and without the surfactant (FIG. 5b), the measured current reached around 8 μA (i.e. greater by a factor of 100). Furthermore, after about 1000 seconds (without the surfactant), the intensity of the light was varied rapidly. As shown in FIG. 5b, the electrical response 522 was able to follow the variations.

In order to exclude any heating effect on the apparatus due to the proximal light source, a glass slide was positioned between the light source and the apparatus to act as a heat shield. This time the resistance of the percolation network was monitored rather than the current flowing through the percolation network.

Figure 6:
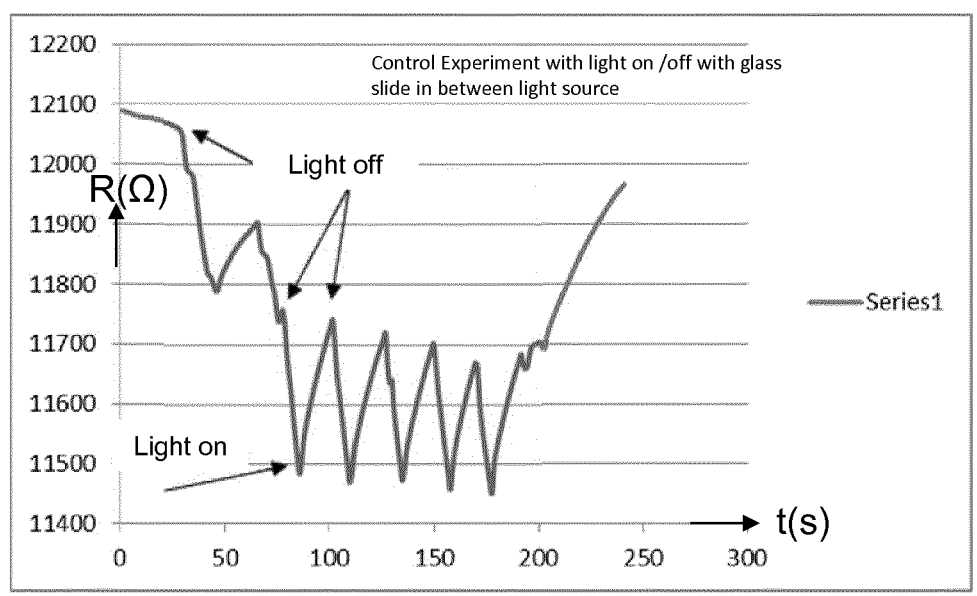
FIG. 6 shows the electrical behaviour of an apparatus comprising a percolation network and a heat shield in response to light exposure.

FIG. 6 shows the variation in resistance as the light intensity was varied as before (without the presence of surfactant). As can be seen, the resistance of the percolation network decreased with increasing light intensity and continued to follow the intensity variations.

The percolation network was then loaded onto a controlled deformation system to test the electrical response of the apparatus to incident light following mechanical deformation. The percolation network was put through a series of 100 bending cycles at a bending radius of 40-50 mm and was then exposed to the light (again, without the presence of surfactant). The intensity of the light was then varied to determine the dynamic response. The percolation network was subsequently put through a further 900 bending cycles (i.e. 1000 bending cycles in total) and the measurements were repeated.

Figure 7:
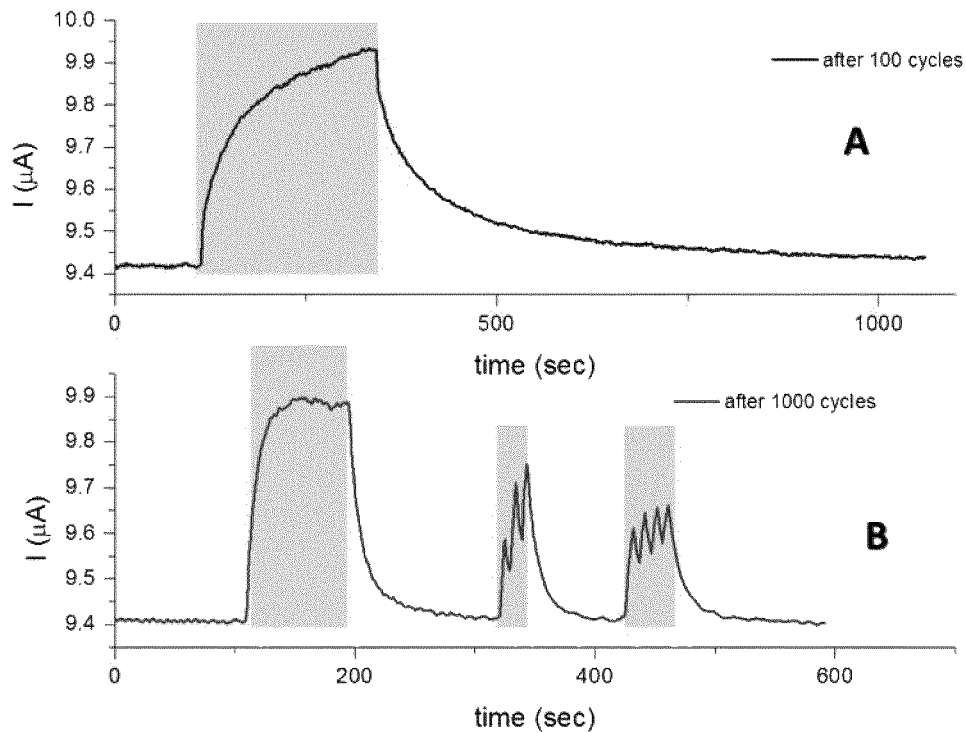
FIG. 7a shows the electrical behaviour of an apparatus comprising a percolation network in response to light exposure after 100 bending cycles.
FIG. 7b shows the electrical behaviour of an apparatus comprising a percolation network in response to light exposure after 1000 bending cycles.

FIG. 7a shows the electrical behaviour in response to light exposure after 100 bending cycles, and FIG. 7b shows the electrical behaviour in response to light exposure after 1000 bending cycles. These graphs show that the photo response of the apparatus remains unchanged after repeated deformation of the percolation network.

The electrical response to an applied bending stress was then monitored by decreasing the bending radius of the percolation network in a stepwise approach to a minimum radius of around 30 mm and measuring the resistance. The bending radius was then increased again until the percolation network was back to its original unstressed (flat) state. This process was repeated for over 1000 bending cycles.

Figure 8A:
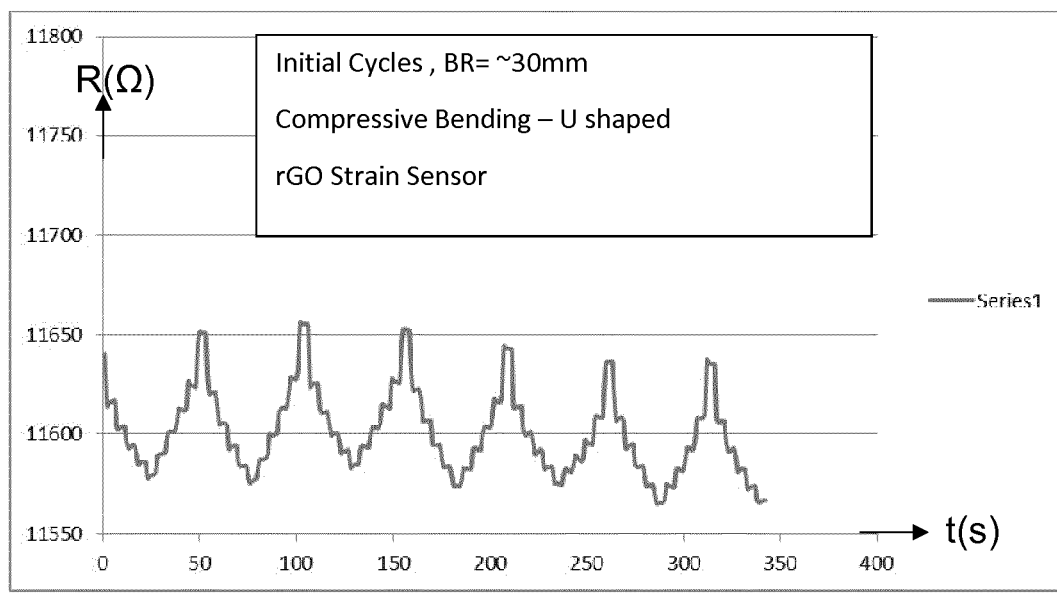
FIG. 8a shows the electrical behaviour of an apparatus comprising a percolation network in response to repeated bending.
Figure 8B:
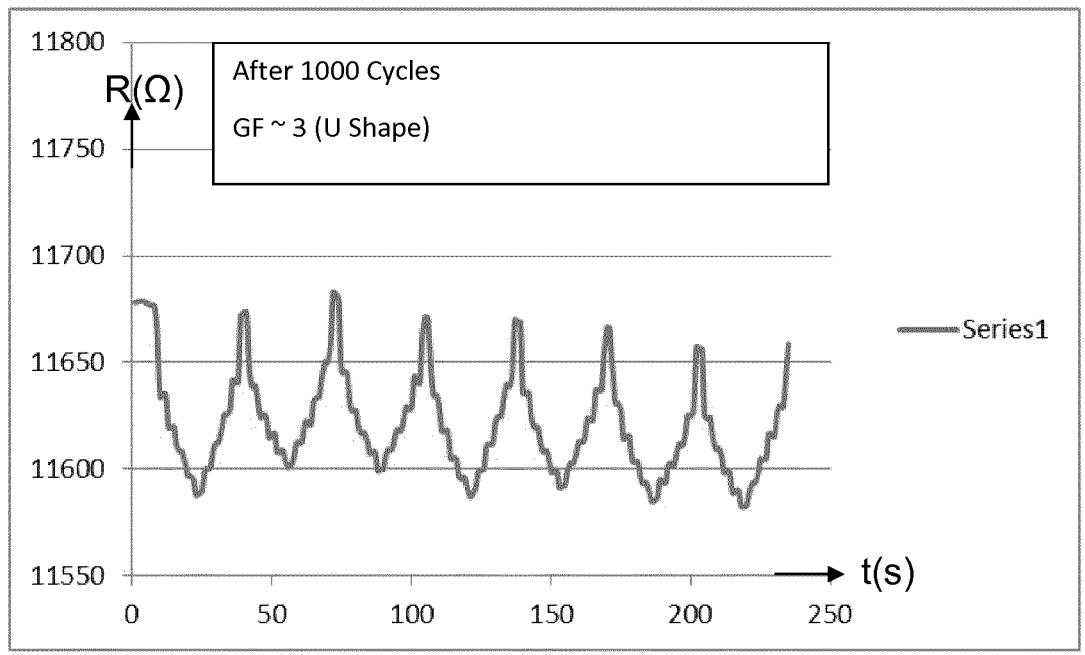
FIG. 8b shows the electrical behaviour of an apparatus comprising a percolation network in response to further repeated bending.

FIG. 8a shows the initial electrical behaviour of the apparatus in response to repeated bending, and FIG. 8b shows the electrical behaviour of the apparatus in response to repeated bending after 1000 bending cycles. As can be seen, the resistance of the percolation network was proportional to the applied stress at all times during the bending experiment. In particular, the resistance was found to reproducibly increase with the bending radius.

As a final test, the apparatus was exposed to light and stress in combination. In this experiment, the resistance of the percolation network was monitored whilst the percolation network was put through repeated bending cycles. During this time, the light source was switched on an off at a lower frequency than the bending cycles in order to enable differentiation of the individual responses to the different respective stimuli.

Figure 9:
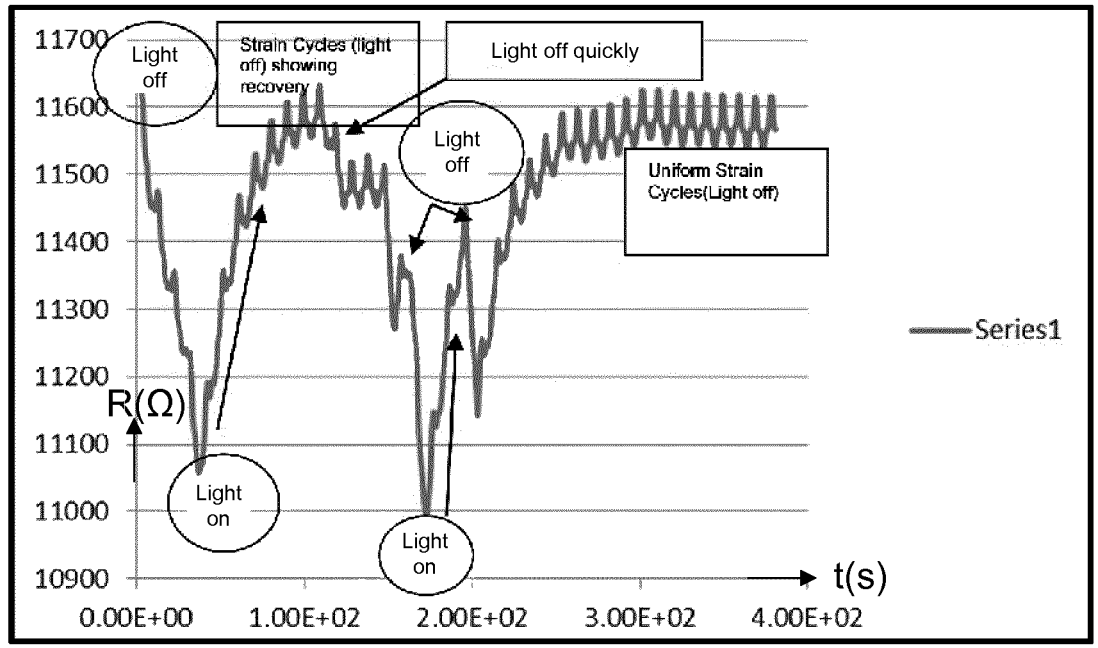
FIG. 9 shows the electrical behaviour of an apparatus comprising a percolation network in response to light exposure and repeated bending in combination.

FIG. 9 shows the electrical behaviour of the apparatus in response to light exposure and repeated bending in combination. In consistency with the previous experiments, the resistance was found to decrease with increasing light intensity and increase with increasing bending radius.

These experiments demonstrate that an apparatus comprising the percolation network described herein may be used as a light sensor and/or as a bidirectional strain sensor. As mentioned previously, however, the apparatus may also be used to detect or measure other physical stimuli provided that said stimuli are capable of inducing a reproducible change in the flow of charge carriers through the percolation network. Other examples include temperature and relative humidity.

Further experiments have shown that the sensitivity of the percolation network to a particular stimulus is dependent upon the thickness of the percolation network. For example, it has been found that the percolation network is sensitive to humidity at a thickness of 5-250 nm (and in particular 100-200 nm); is sensitive to temperature at a thickness of at least 500 nm (and in particular 500-1000 nm); and is sensitive to light and strain at a thickness of at least 500 nm (and in particular 500-2000 nm).

As a result of this thickness dependency, it is possible to tune the percolation network to a particular stimulus simply by controlling its thickness. At a predetermined thickness, the reduced graphene oxide flakes are functionalised to selectively facilitate detectable changes in the flow of charge carriers in response to the particular stimulus.

FIG. 10a shows an apparatus comprising a percolation network 1001 in cross-section, and FIG. 10b shows the same apparatus in plan view. The supporting substrate 1009 and the source 1006 and drain 1007 electrodes are also shown. The length, width and thickness dimensions of the percolation network 1001 are denoted by the letters "l", "w" and "t", respectively. The dimensions of the percolation network 1001 can be controlled by setting one or more parameters of the deposition process (e.g. printing, inkjet printing, spray coating, screen printing or drop casting) to deposit a predetermined amount of rGO ink. If inkjet printing is used to deposit the ink, the length and width can be controlled by the size and/or shape of the nozzle, and the thickness can be controlled by the number of printing passes. For example, using a 1-10 picolitre inkjet nozzle, one or more of the length and width of the percolation network 1001 can be as small as 0.1 mm but not limited to this. In addition, a thickness of 5 nm-250 nm (for sensing humidity) can be achieved with 1-5 printing passes; a thickness of 500-1000 m (for sensing temperature) can be achieved with 10-20 printing passes; and a thickness of 500-2000 nm (for sensing light or strain) can be achieved with 10-40 printing passes. The ink parameter such as viscosity/temperature can have an effect in the control parameters of the printing process which can be adjusted to suit the needs of the skilled user.

To test the humidity-sensing ability of the percolation network 1001, interdigitated silver electrodes 1006, 1007 were screen printed onto a polyethylene naphthalate (PEN) substrate 1009 followed by deposition and subsequent drying of the rGO ink to form a 100-150 nm percolation network 1001. Until now, graphene-based humidity sensors could not be fully printed because (i) previous GO solutions have tended to clog the printing nozzles; and (ii) the polarity of the GO solutions have tended to hinder the formation of the ink jet. The rGO ink described herein addresses these issues.

A Dimatix™ Materials Printer (DMP-2831) was used to deposit the rGO ink with 4 printing passes. This inkjet printer allows the deposition of fluidic materials onto an 8×11 inch (A4) substrate using a disposable piezo inkjet cartridge. It can be used to form ink patterns over an area of about 200-300 nm and accepts substrates of up to 25 mm in thickness with an adjustable Z-height. The temperature of the vacuum plate which secures the substrate in place can be adjusted up to 60° C. The printer uses a MEMS-based cartridge-style print head having a 1.5 ml reservoir. Each single-use cartridge has 16 nozzles linearly spaced at 254 μm with typical drop sizes of 1-10 picolitres. The cartridges can be replaced to facilitate printing of a series of fluids.

The resistance of the percolation network 1001 was then measured using a Keithley™ source meter whilst the percolation network 1001 was exposed to periodic changes in humidity via exhaled air.

FIG. 11 shows the variation in resistance with humidity. As can be seen from this graph, the apparatus exhibited a high open-circuit resistance under normal room conditions which decreased with increasing humidity. The sharp changes in resistance demonstrate the sensitivity of the percolation network 1001 to the humidity of the surrounding environment. Depending on the thickness of the film the sensor can perform in ultrafast detection mode (e.g. 10 ms response time up to 90% of the total rise time and back)

As mentioned above, it is possible to tune the percolation network to a particular stimulus by controlling its thickness. This concept can be exploited further to form an apparatus which is sensitive to multiple stimuli using two or more percolation networks each having a predetermined thickness associated with the detection of a particular respective stimulus. In this scenario, some or all of the percolation networks may have the same predetermined thickness (e.g. by depositing the same amount of rGO ink) to enable detection of the same stimulus. Additionally or alternatively, some or all of the percolation networks may have different predetermined thicknesses (e.g. by depositing different amounts of rGO ink) to enable detection of different respective stimuli.

Furthermore, the controlled amounts of rGO ink may be deposited adjacent to one another to form an array of percolation networks (e.g. a one, two or three dimensional array), or they may be deposited on top of one another to form a stack of percolation networks. Also, two or more preformed percolation networks could be laminated together (e.g. using anisotropic conductive adhesive) after drying the rGO ink to form the stack. When the percolation networks are arranged to form a stack, electrically insulating layers may be used to separate adjacent percolation networks of the stack to prevent electrical shorting. When the perlocation networks are arranged to form a stack other 2D materials can be used by printed to form multiples stacked layers for creating functionalised devices.

Figure 12A:
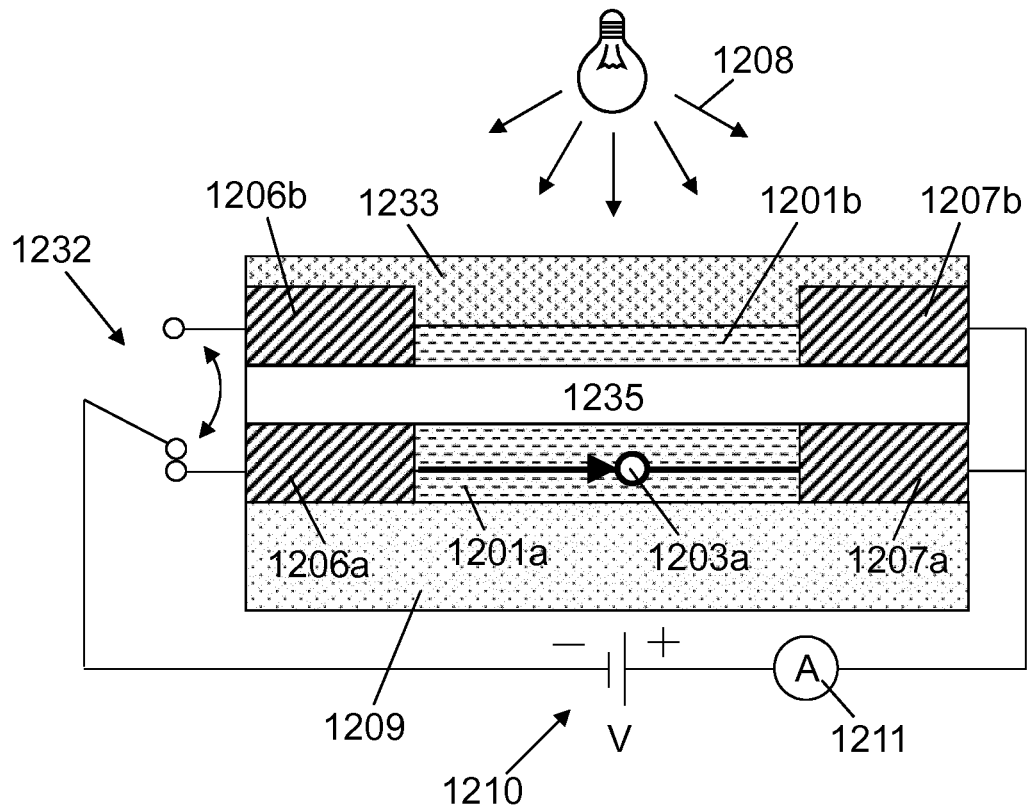
FIG. 12a shows the use of an apparatus comprising a plurality of percolation networks of different predetermined thicknesses to detect light.

FIG. 12a shows an apparatus comprising a first percolation network 1201a configured to detect light 1208 and a second percolation network 1201b configured to detect humidity 1234. In this example, the thickness of the first percolation network 1201a (>500 nm) is greater than the thickness of the second percolation network 1201b (25-250 nm). In addition, the second percolation network 1201b is positioned on top of the first percolation network 1201a to form a stack, the first 1201a and second 1201b percolation networks separated from one another by an electrically insulating layer 1235. An optional passivation layer 1233 is formed on top of the stack to physically and electrically insulate the underlying percolation networks 1201a, b. The passivation layer 1233 is sufficiently porous to allow exposure of the second percolation network 1233 to the air of the surrounding environment to enable the detection of humidity. Furthermore, the passivation layer 1233, second percolation network 1201b and electrically insulating layer 1235 are each sufficiently optically transparent to allow exposure of the first percolation network 1201a to incident light 1208 from the surrounding environment to enable detection of the incident light 1208.

The apparatus also comprises a respective pair of source 1206a, b and drain 1207a, b electrodes for use with each percolation network 1201a, b, and a switch 1232 configured to selectively enable a potential difference 1210 to be applied to one of the percolation networks 1201a, b. This configuration allows the readout of one percolation network 1201a, b (and therefore the detection of one stimulus 1208, 1234) at any given time. In other examples, however, a potential difference 1210 could be applied to the first 1201a and second 1201b percolation networks at the same time to allow the detection of both stimuli 1208, 1234 in parallel. Also, rather than using a respective pair of source 1206a, b and drain 1207a, b electrodes for each percolation network 1201a, b, the apparatus could comprise a single pair of source 1206 and drain 1207 electrodes which are common to both the first 1201a and second 1201b percolation networks.

In FIG. 12a, the switch 1232 is set to a first position to apply the potential difference 1210 between the source 1206a and drain 1207a electrodes associated with the first percolation network 1201a to enable the detection of incident light 1208. The flow of charge carriers 1203*a* through the first percolation network 1201*a* in response to the incident light 1208 is shown by the arrow. A measurement of the resulting current using the ammeter 1211 can then be used to determine the presence and/or magnitude of the incident light 1208 (although other electrical properties could be measured instead using suitable electrical meters).

Figure 12B:
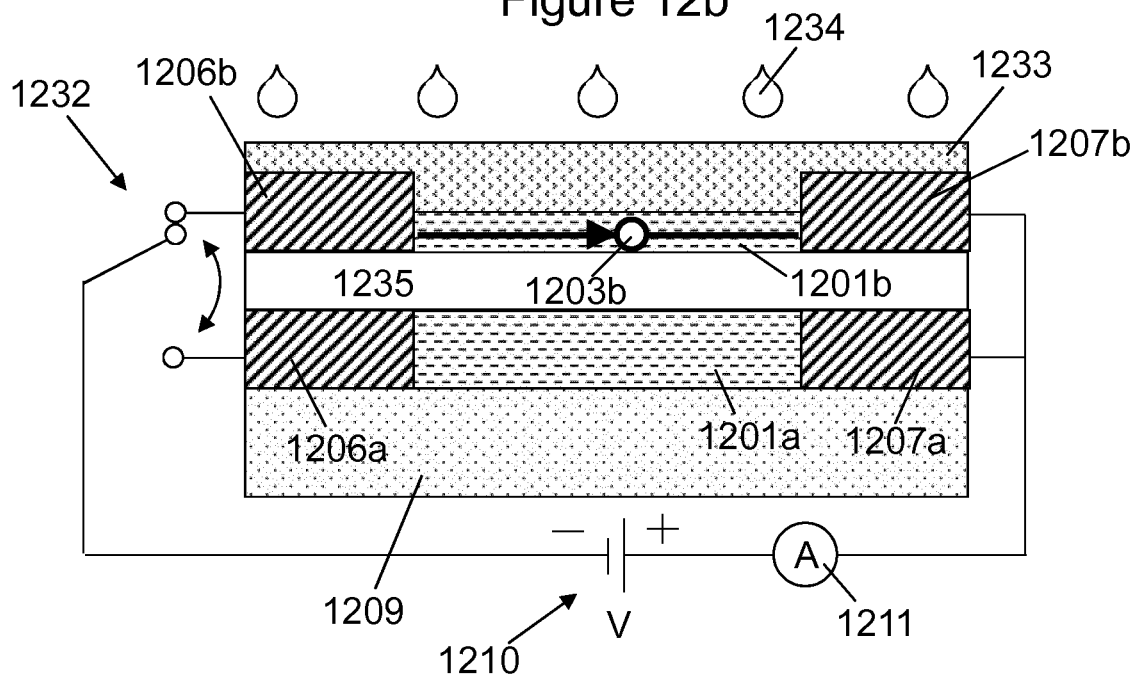
FIG. 12b shows the use of an apparatus comprising a plurality of percolation networks of different predetermined thicknesses to detect humidity.

FIG. 12*b* shows the apparatus of FIG. 12*a* but with the switch 1232 set to a second position to apply the potential difference 1210 between the source 1206*b* and drain 1207*b* electrodes associated with the second percolation network 1201*b* to enable the detection of humidity 1234. The flow of charge carriers 1203*b* through the second percolation network 1201*b* in response to the humidity 1234 of the surrounding environment is shown by the arrow. A measurement of the resulting current using the ammeter 1211 can then be used to determine the water content of the air (although other electrical properties could be measured instead using suitable electrical meters). In some cases, the water content may be measured with respect to saturation to provide a measurement of the relative humidity.

Figure 13:
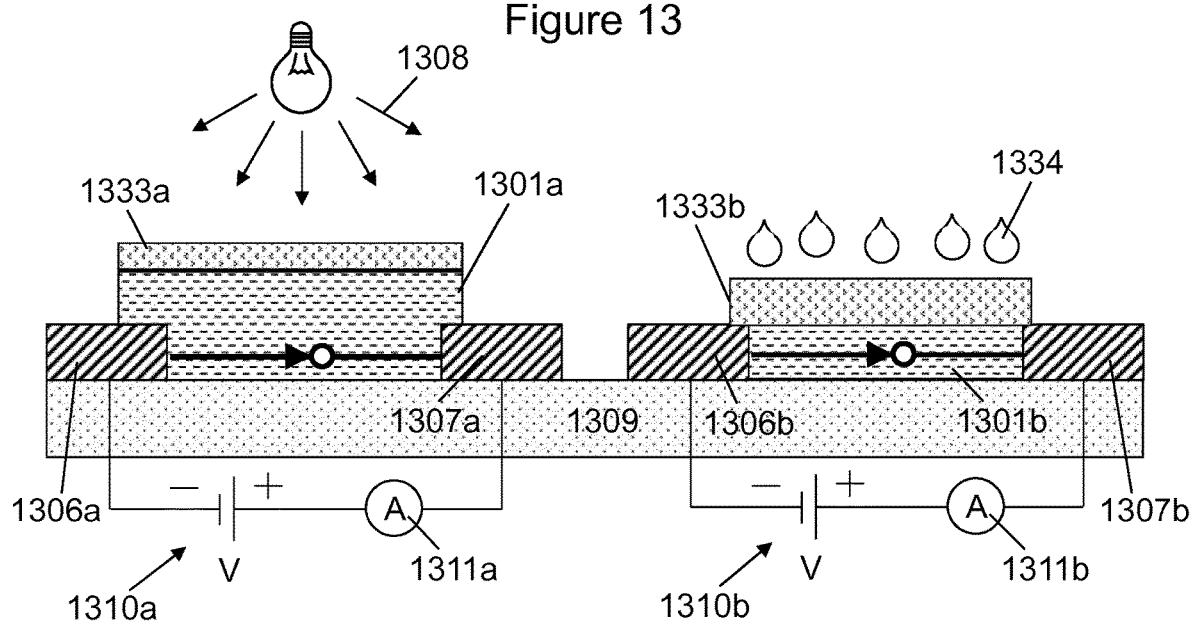
FIG. 13 shows the use of an apparatus comprising a plurality of percolation networks of different predetermined thicknesses to detect light and humidity.

FIG. 13 shows another example of an apparatus comprising a plurality of percolation networks 1301*a*, 1301*b*. In this example, the first 1301*a* and second 1301*b* percolation networks of FIGS. 12*a* and 12*b* are arranged adjacent to one another on the substrate 1309 to form an array. An optional passivation layer 1333*a* is formed on top of each percolation network 1301*a, b*, and separate power supplies are provided for applying a potential difference 1310*a, b* across the respective pairs of source 1306*a, b* and drain 1307*a, b* electrodes. Separate ammeters 1311*a, b* are also provided for measuring the current through each percolation network 1301*a, b*. In other examples, a common power source, ammeter 1311 and electrode pair 1306, 1307 may be used for both percolation networks 1301*a, b*.

Since the second percolation network 1301*b* is adjacent to the first percolation network 1301*a* rather than on top of the first percolation network 1301*a*, there is no need for the second percolation network 1301*b* (or its associated passivation layer 1333*b*) to be substantially optically transparent. There is also no need for the passivation layer 1333*a* associated with the first percolation network 1301*a* to be sufficiently porous, or the use of electrically insulating layers 1335 to separate the first and second percolation networks 1301*a, b*.

A particular advantage of the percolation network described herein is the fact that it is able to exhibit a fast measurable photosensitive response without the need for any additional light absorbing materials to enhance the interaction of the apparatus with photons. As discussed, the use of quantum dots requires complicated fabrication and toxic materials such as lead and cadmium. The percolation network is also reversibly deformable and can be printed using a stable rGO ink. In theory, 2 ml of the rGO ink may be used to print a few hundred sensors. Depending on the thickness of the percolation network and the removal of the surfactant molecules, fully or partially transparent sensors can be made using this process.

Figure 14A:
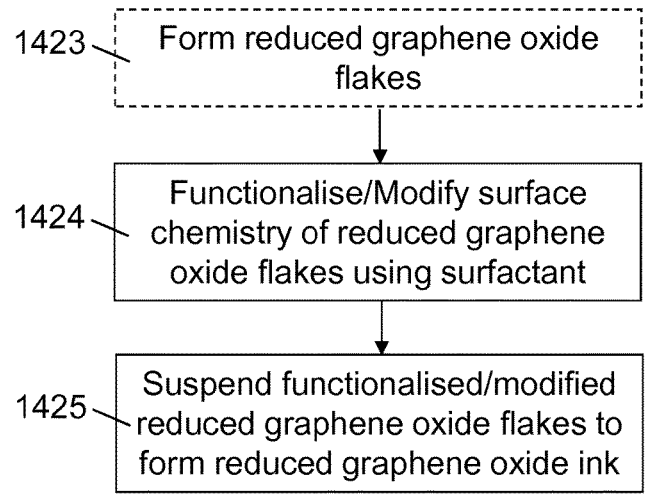
FIG. 14a shows a method of forming a reduced graphene oxide ink.
Figure 14B:
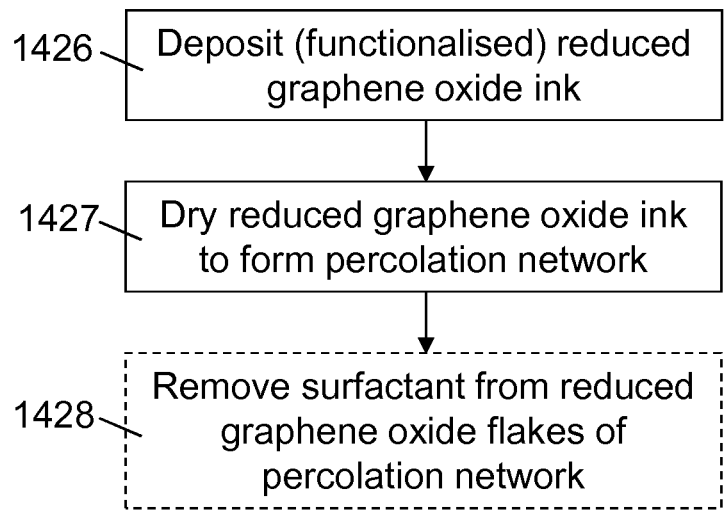
FIG. 14b shows a method of forming a percolation network using a reduced graphene oxide ink.
Figure 14C:
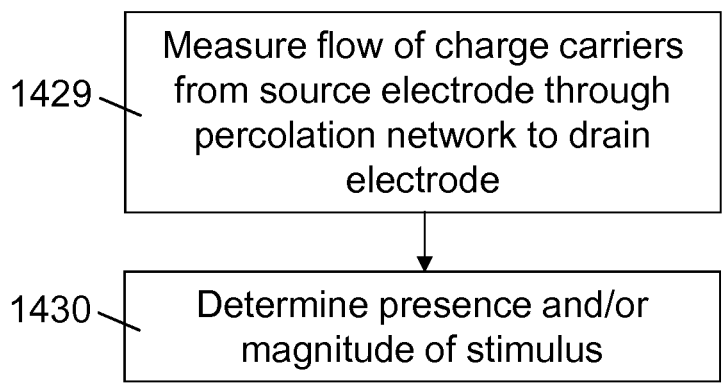
FIG. 14c shows a method of detecting/measuring a stimulus using an apparatus comprising a percolation network.

FIG. 14*a* shows the main steps 1423-1425 of a method of forming a rGO ink; FIG. 14*b* shows the main steps 1426-1428 of a method of forming a percolation network using a reduced graphene oxide ink; and FIG. 14*c* shows the main steps 1429-1430 of a method of detecting/measuring a stimulus using an apparatus comprising a percolation network. The steps 1423, 1428 of FIGS. 14*a* and 14*b* shown in dashed boxes are optional. Furthermore, regarding FIG. 14*a*, the reduced graphene oxide flakes may be suspended within a liquid or solvent comprising the surfactant. In this respect, steps 1424 and 1425 may be combined into a single step.

The process which was used to form the apparatus comprising a single percolation network will now be described:

A PEN substrate was screen printed with silver interdigitated electrodes. Pre-made rGO can be sourced from companies such as Graphene Square or Graphenea, or it may be obtained from graphite using the Hummer method. In the present case, a solution of rGO was obtained by reducing GO using ascorbic acid (LAA). LAA was added to an aqueous GO solution at a ratio 1:10 under vigorous stirring. The solution was then kept at 60° C. for 60 minutes and then at room temperature under stirring for about one day. The obtained rGO solution was then washed in order to remove the excess LAA.

The solution was centrifuged at 13000 rpm for two minutes. As a result of the hydrophobicity of rGO, the resulting solution consisted of a supernatant and a rGO precipitate. The supernatant was then exchanged with pure water and re-dispersed by vigorous mixing with a hand vortex. This process was repeated 4 times and left to dry at 60°. Once the water had evaporated, the precipitate was then re-dispersed in an aqueous solution of Triton™ X-100 with a concentration of 8 mg/ml and stirred at room temperature for one day. The solution was then sonicated 5 times at room temperature for 5 minutes to produce a solution containing rGO coated with surfactant which was ready for deposition.

The solution was drop casted on top of the interdigited silver electrodes previously printed onto the PEN substrate. After the solution had been allowed to dry, the Triton™ X-100 was washed away by immersing the device in toluene at room temperature for one minute and then sonicated for 10 seconds.

As mentioned previously, one or more controlled amounts of the rGO solution can be deposited and subsequently dried to provide percolation networks having predetermined thicknesses associated with the detection of particular respective stimuli. The formation of multiple percolation networks can be used to produce an array and/or stack of sensors suitable for detecting the same or different stimuli.

Figure 15:
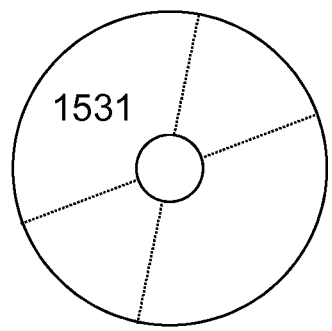
FIG. 15 shows a computer-readable medium comprising a computer program configured to perform, control or enable one or more method steps of FIG. 14a, 14b or 14c.

FIG. 15 illustrates schematically a computer/processor readable medium 1531 providing a computer program according to one embodiment. In this example, the computer/processor readable medium 1531 is a disc such as a digital versatile disc (DVD) or a compact disc (CD). In other embodiments, the computer/processor readable medium 1531 may be any medium that has been programmed in such a way as to carry out an inventive function. The computer/processor readable medium 1531 may be a removable memory device such as a memory stick or memory card (SD, mini SD, micro SD or nano SD).

The computer program may comprise computer code configured to perform, control or enable one or more of the method steps 1423-1425, 1426-1428, 1429-1430 of FIG. 14*a*, 14*b* or 14*c*. In particular, the computer program may be configured to measure an electrical property of the percolation network (e.g. current, resistance or conductivity), and derive the presence and/or magnitude of the physical stimulus using the measured electrical property. Additionally or alternatively, the computer program may be configured to control the above-mentioned fabrication processes to form the rGO ink, percolation network and/or apparatus.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. A percolation network comprising:
reduced graphene oxide flakes arranged to partially overlap portions of directly adjacent reduced graphene oxide flakes along lengths thereof in a planar direction to allow for a flow of charge carriers through the percolation network in three dimensions,
wherein the reduced graphene oxide flakes are functionalised to facilitate detectable changes in the flow of charge carriers in response to a stimulus to the percolation network,
wherein the reduced graphene oxide flakes are functionalised with a surfactant, and
wherein the graphene oxide flakes are separated from each other by a regular spacing.

2. The percolation network of claim 1, wherein the reduced graphene oxide flakes are functionalised to comprise an even distribution of reduced graphene oxide flakes.

3. The percolation network of claim 2, wherein the distribution further comprises a non-clustering of reduced graphene oxide flakes.

4. The percolation network of claim 1, wherein the reduced graphene oxide flakes are planar, and wherein the reduced graphene oxide flakes are functionalised such that planes of the reduced graphene oxide flakes are aligned parallel to one another.

5. The percolation network of claim 4, wherein the planes of the reduced graphene oxide flakes are aligned to within 5° of one another.

6. The percolation network of claim 1, wherein the reduced graphene oxide flakes are functionalised such that the percolation network comprises an overlapping stacked arrangement of the reduced graphene oxide flakes.

7. The percolation network of claim 6, wherein at least 50% of the reduced graphene oxide flakes overlap with another reduced graphene oxide flake of the percolation network.

8. The percolation network of claim 1, wherein the percolation network has a thickness associated with detection of a particular stimulus.

9. The percolation network of claim 8, wherein the thickness is such that the reduced graphene oxide flakes are functionalised to selectively facilitate detectable changes in the flow of charge carriers in response to the particular stimulus.

10. The percolation network of claim 8, wherein the particular stimulus is humidity, and the associated thickness is 5 nm-250 nm.

11. The percolation network of claim 8, wherein the particular stimulus is temperature, and the associated thickness is at least 500 nm.

12. The percolation network of claim 8, wherein the particular stimulus is light or strain, and the associated thickness is at least 500 nm.

13. An apparatus comprising:
a percolation network comprising reduced graphene oxide flakes, the reduced graphene oxide flakes arranged to partially overlap portions of directly adjacent reduced graphene oxide flakes along lengths thereof in a planar direction to allow for a flow of charge carriers through the percolation network in three dimensions,
wherein the reduced graphene oxide flakes are functionalised to facilitate detectable changes in the flow of charge carriers in response to a stimulus to the percolation network,
wherein the reduced graphene oxide flakes are functionalised with a surfactant, and
wherein the graphene oxide flakes are spaced apart from each other by a regular spacing.

14. The apparatus of claim 13 further comprises at least another percolation network giving the apparatus two or more percolation networks, each percolation network having a thickness associated with detection of a particular stimulus.

15. The apparatus of claim 14, wherein the two or more percolation networks are arranged to form a stack of layers or an array of layers.

16. The apparatus of claim 15, wherein an uppermost percolation network of the stack has a thickness associated with detection of humidity, and wherein the apparatus comprises a passivation layer on top of the uppermost percolation network which is sufficiently porous to allow exposure of the uppermost percolation network to air of a surrounding environment to enable the detection of humidity.

17. The apparatus of claim 15, wherein a percolation network of the stack has a thickness associated with detection of light, and wherein each of the layers of the apparatus above the percolation network are sufficiently optically transparent to allow exposure of the percolation network to incident light from a surrounding environment to enable detection of the incident light.

18. The apparatus of claim 15, wherein the apparatus comprises one or more electrically insulating layers configured to separate adjacent percolation networks of the stack.

* * * * *